US005550973A

United States Patent [19]

Forman et al.

[11] Patent Number: 5,550,973
[45] Date of Patent: Aug. 27, 1996

[54] SYSTEM AND METHOD FOR FAILURE RECOVERY IN A SHARED RESOURCE SYSTEM HAVING A MOVING WRITE LOCK

[75] Inventors: Ira R. Forman; Hari H. Madduri, both of Austin, Tex.

[73] Assignee: International Business Machines Corporation, Armonk, N.Y.

[21] Appl. No.: 405,420

[22] Filed: Mar. 15, 1995

[51] Int. Cl.⁶ .................................................... G06F 13/16
[52] U.S. Cl. ........................................................ 395/182.03
[58] Field of Search ................................. 395/575, 200, 395/250, 650, 375, 725, 182.08; 371/8.1

[56] References Cited

U.S. PATENT DOCUMENTS

| | | | |
|---|---|---|---|
| 4,805,106 | 2/1989 | Pfeifer | 364/200 |
| 4,819,159 | 4/1989 | Shipley et al. | 364/200 |
| 4,961,134 | 10/1990 | Crus et al. | 364/200 |
| 4,965,715 | 10/1990 | Yoshida | 364/200 |
| 4,965,719 | 10/1990 | Shoens et al. | 364/200 |
| 4,991,079 | 2/1991 | Dann | 395/200.08 |
| 5,003,466 | 3/1991 | Schan, Jr. et al. | 395/183.17 |
| 5,109,329 | 4/1992 | Strelioff | 395/725 |
| 5,175,852 | 12/1992 | Johnson et al. | 395/600 |
| 5,197,148 | 3/1993 | Blount et al. | 395/575 |
| 5,301,337 | 4/1994 | Wells et al. | 395/800 |
| 5,307,483 | 4/1994 | Knipfer et al. | 395/182.08 |
| 5,339,427 | 8/1994 | Elko et al. | 395/725 |
| 5,423,044 | 6/1995 | Sutton et al. | 395/725 |
| 5,463,733 | 10/1995 | Forman et al. | 395/182.08 |
| 5,469,575 | 11/1995 | Madduri | 395/200.03 |

Primary Examiner—Robert W. Beausoliel, Jr.
Assistant Examiner—Stephen C. Elmore
Attorney, Agent, or Firm—Mark S. Walker; Jenkens & Gilchrist, P.C.

[57] ABSTRACT

The system and method of the present invention provides for recovery from failure of a distributed processing system process designated as a master process for at least one shared resource. The system of the invention provides for detection of the failure by one or more of the shadow processes. The detecting process tests to determine whether it has the shared write lock managed by the master process. If it does, it becomes the master process. If not, it determines from the shared control file which process holds the write lock and it communicates to that process a request to assume master process responsibilities.

3 Claims, 3 Drawing Sheets

SYSTEM AND METHOD FOR FAILURE RECOVERY IN A SHARED RESOURCE SYSTEM HAVING A MOVING WRITE LOCK

BACKGROUND OF THE INVENTION

1. Field of the Invention

The present invention relates to the operation of distributed processing computer systems. In particular it relates to those systems that have a plurality of processing nodes each one having access to a copy of at least one replicated data object and which require apparatus and methods for managing access to the replicated data object. Still more particularly, the present invention relates to the management of a write lock that grants permission to one of a number of distributed processes allowing that process to update a data item.

2. Background and Related Art

Distributed computer systems are created by linking a number of computer systems using a communications network. Distributed systems frequently have the ability to share data resident on a single system. Replicated data systems implement data sharing by providing a replica copy of a data object to each process using that data object. Replication reduces the access time for each processor by eliminating the need to send messages over the network to retrieve and supply the necessary data. A replicated object is a logical unit of data existing in one of the computer systems but physically replicated to multiple distributed computer systems. Replicated copies are typically maintained in the memories of the distributed systems.

Replicated data objects also speed the update process by allowing immediate local update of a data object. Replication introduces a control problem, however, because many copies of the data object exist. The distributed system must have some means for controlling data update to ensure that all copies of the data remain consistent.

Prior art systems control data consistency by establishing a master data object copy in one of the distributed systems. The master copy is always assumed to be valid. Data object update by a system other than that of the master copy requires sending of the update to the master for update and propagation to all replicas. This approach has the disadvantage of slowing local response time as the master data object update and propagation are performed.

Another means for controlling replicated data is described in *Updating Replicated Objects in a Plurality of Memory Partitions,* U.S. Pat. No. 5,418,966. The apparatus and method of that invention require that a single "write lock" exist in a distributed system and be passed to each process on request. Data object updates can only be performed by the holder of the "write lock." The "write lock" holder may update the local object copy and then send that update to the master processor for its update and propagation to other processes. The above patent application is incorporated by reference.

The method for determining which of a number of distributed processes is to be master is described in U.S. Pat. No. 5,469,975 and entitled *Determining a Winner of a Race in a Data Processing System,* commonly assigned. The "race" between each process potentially controlling a resource results in the assignment of master status to the process first establishing write control over a Share Control File. Once control has been established by one process, other processes are assigned "shadow" status. Master process failure causes reevaluation of master status. This patent application is also incorporated by reference.

The technical problem addressed by the present invention is providing fault-tolerant features to a distributed processing system using write lock management of replicated data objects. Fault tolerance is required to ensure that no data or updates are lost due to the failure of a master process. Prior art systems, including those referenced above, require the master determination and write lock control to be reinitialized. This could result in loss of data if a locally updated data object replica has not been propagated to the master or other replicas.

SUMMARY OF THE INVENTION

The present invention is directed to an improved system and method for managing write locks in distributed processing systems.

The present invention offers an improved system and method for recovering from master failure in a write lock control system. The present invention is directed to a system and method that ensures the designation of a new master process considers data integrity by determining which of the shadow processes has the most current data object and attempting to make that shadow the master.

The present invention is directed to a method of recovering from process failure in a computer system having at least one computer processor with memory, where each data object of a plurality of data objects is replicated in a plurality of address spaces, wherein one of the processes is designated a master process for the data object and all other processes seeking access designated as shadow processes, and wherein the master process controls sharing of a write lock to permit at most one process to update the replicated data, the method comprising: receiving in at least one of the shadow processors an indicia of failure of the master process; testing to determine whether the one of the shadow processes currently holds the write lock; transferring master process control to the one of the shadow processes if the process currently holds the write lock; testing to determine which of the shadow processes hold the write lock if the receiving one of the shadow processes does not; requesting the shadow process holding the lock to establish itself as the master process.

It is therefore an object of the present invention to provide a fault tolerant distributed system having replicated data object.

It is yet another object of the invention to assure that no data is lost due to master process failure.

It is still another object of the invention to ensure that the process currently holding a write lock as a first opportunity to become the master process.

The foregoing and other objects, features and advantages of the invention will be apparent from the following more particular description of a preferred embodiment of the invention, as illustrated in the accompanying drawing wherein like reference numbers represent like parts of the invention.

DETAILED DESCRIPTION

The present invention is practiced in a distributed processing computer environment. This environment consists of a number of computer processors linked together by a communications network. Alternatively, the present invention could be practiced in a multiprogramming system in which a single computer (e.g. single CPU) supports the execution of multiple processes each having a separate address space.

Figure 1:
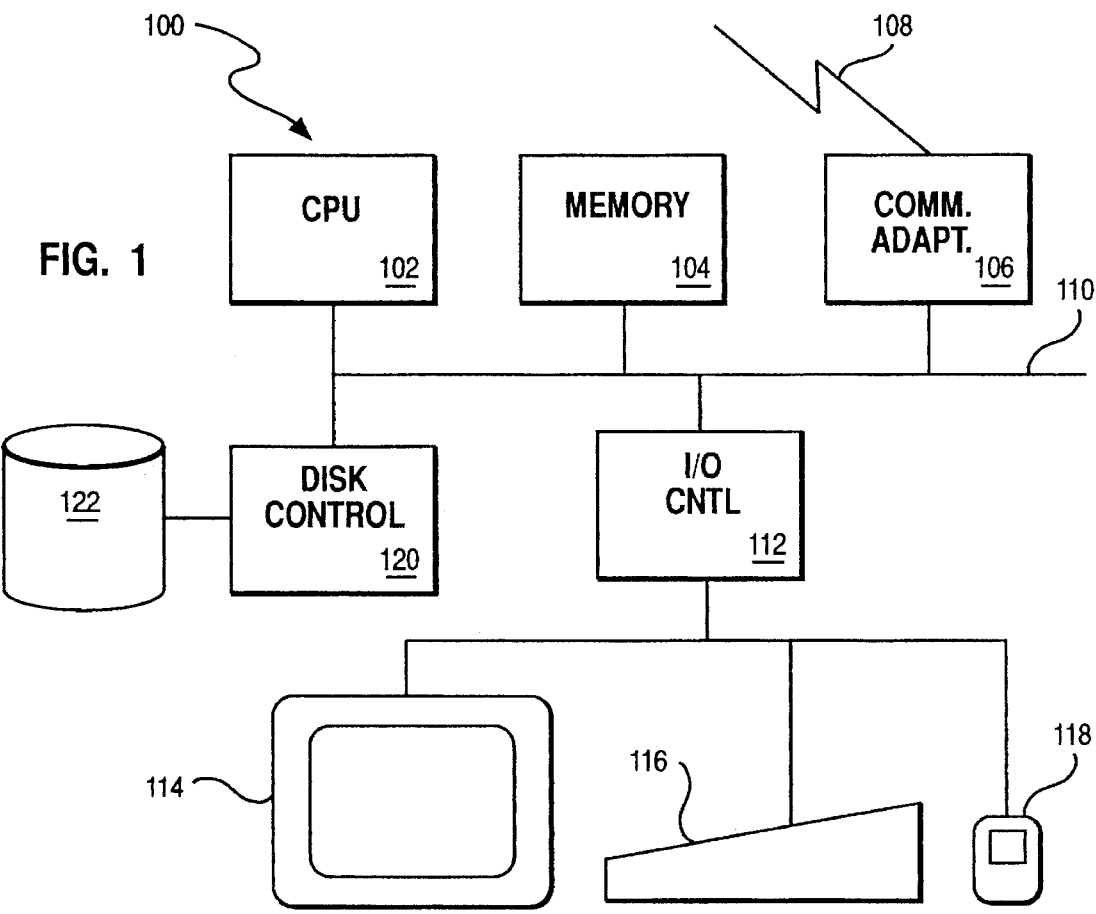
FIG. 1 is a block diagram of a computer system of the type in which the present invention is embodied.

The preferred embodiment is practiced with linked computers. Each of the computers has the components shown generally for the system 100 in FIG. 1. Processing is provided by central processing unit or CPU 102. CPU 102 acts on instruction and data stored in random access memory 104. Long term storage is provided on one or more disks 122 operated by disk controller 120. A variety of other storage media could be employed including tape, CD-ROM, or WORM drives. Removable storage media may also be provided to store data or computer process instructions. Operators communicate with the system through I/O devices controlled by I/O controller 112. Display 114 presents data to the operator while keyboard 116 and pointing device 118 allow the operator to direct the computer system. Communications adapter 106 controls communications between this processing unit and others on a network to which it connected by network interface 108.

Computer system 100 can be any known computer system including microcomputers, mini-computers and mainframe computers. The preferred embodiment envisions the use of computer systems such as the IBM Personal System/2 (PS/2) or IBM RISC System/6000 families of computers. (IBM, Personal System/2, PS/2 and RISC System/6000 are trademarks of the IBM Corp.) However, workstations from other vendors such as Sun or Hewlett Packard may be used, as well as computers from Compaq or Apple.

Figure 2:
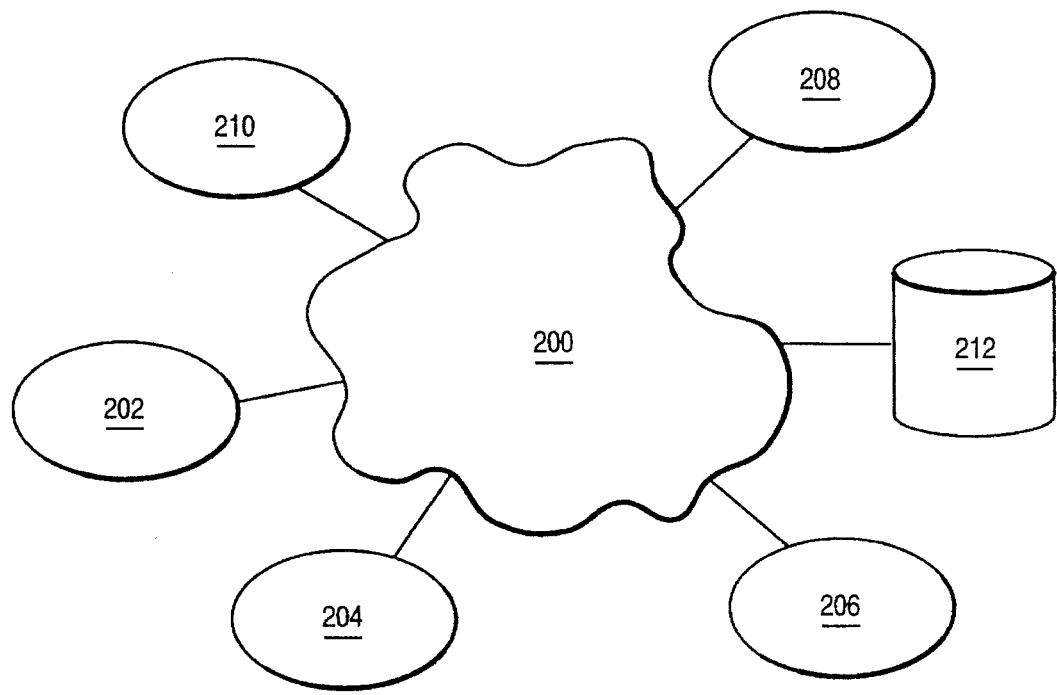
FIG. 2 is a block diagram of a distributed network according to the present invention.

A distributed processing system is shown in FIG. 2. Each of the processing nodes 202, 204, 206, 208, 210 is connected to a network 200 that enables communications among the processors. Additional permanent storage may be associated with the network as shown by disk storage unit 212. In the alternative, persistent storage in one of the processing nodes could be used for network persistent storage.

Network 200 can be any type of network including LAN, WAN, ATM or other. Physical network protocols such as Ethernet or Token Ring can be used and communications protocols such as TCP/IP or Netbios or Novell Netware can control the network. Network file system management can be provided by a program based on the Sun Microsystems NFS technology or CMU AFS technology. Each of these file system programs allows distributed processes to access and manage data residing on remote systems. These systems create a single logical file system for each processor regardless of the physical location of individual files. NFS is described in greater detail in the IBM Corp. publication *Communication Concepts and Procedures,* Order No. SC23-2203-00.

The variety of permitted networks means that the processing nodes may be distributed throughout a building, across a campus, or even across national boundaries.

The preferred embodiment of the present invention is practiced in a distributed network of peer processing nodes. Peer nodes each have equal status in the network with none being master or slave nodes. Using peer nodes improves network efficiency because there is no single bottleneck through which requests must be funnelled. Instead each node can act independently to perform its functions. Another advantage is that failure of any particular node will not cause the entire network to fail as would be the case where a master processor existed. The disadvantage of peer networks is that there is no focal point for controlling data integrity of replicated data.

Figure 3:
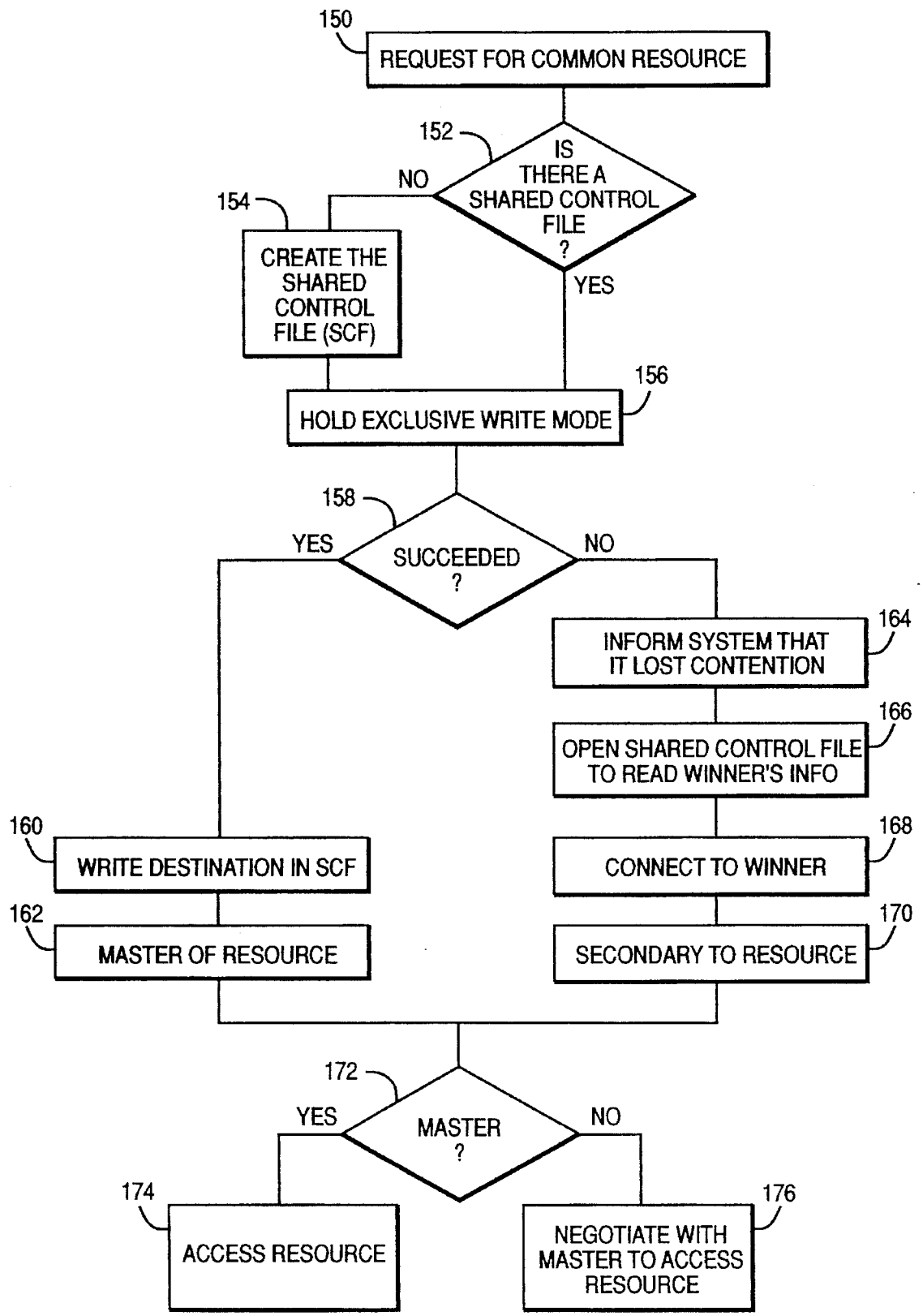
FIG. 3 is a flowchart depicting the master resolution logic of prior art systems.

The above referenced patent *Determining a Winner of a Race in a Data Processing System* teaches a procedure for "racing" for control of a resource. FIG. 3 illustrates the steps of this process. The process starts by generating a request for a common resource 150. The processor requesting the resource tests to determine whether or not a shared control file exists 152. If not, the process creates a shared control file 154. In either case, the process attempts to hold exclusive write access 156. If this is successful 158 the process updates the shared control file 160 and becomes master of that resource 162. If the attempt to acquire exclusive write lock failed, the process is not the master 164 and must read the name of the master from the shared control file 166 and connect to the master 168 as a shadow 170. If the requesting process is the master, it can directly access the resource, otherwise, it is a shadow process and must negotiate with the master for access 176.

The shared control file of the preferred embodiment is a storage file in the logical file system. As such, it resides on one of the permanent storage devices in the distributed system. The present invention is equally applicable, however, to a shared resource control file managed in volatile memory (RAM) that is sharable among the distributed processes.

The master process has the responsibility for managing a write lock that permits the holder to update its copy of the replicated data object. Any process desiring to update a data object first requests the write lock from the master process. If the master does not have the lock, it determines which process does and then sends a message to that process to forward the lock to the requesting process.

Failure of the master process can have two deleterious effects. First, where a shadow process detects master failure and races to establish itself as a new master, it will create a new write lock. (Because it has no knowledge of the previous write lock.) This could result in the presence of two write locks for the same object. The old one and new one. Two processes could therefore be updating the same object without synchronization.

The second effect could be the designation as master process of a process that has an old, back level copy of the data object. This could occur where a shadow process has commenced update but has not completed the process of sending the update to the master for propagation or where the master failed before propagating the data. If a process other than the last updating process becomes master, it will assert its copy of the data object as the current value and will lose the update applied by the other process.

These two effects are overcome by the present invention. The present invention attempts to have the process with the most recent copy of the data object become master. This is typically the process that currently holds the write lock.

The process for handling master failure is modified from the process described in the above referenced patent applications by delaying initiation of a race until attempts to reassign the lock are made.

Figure 4:
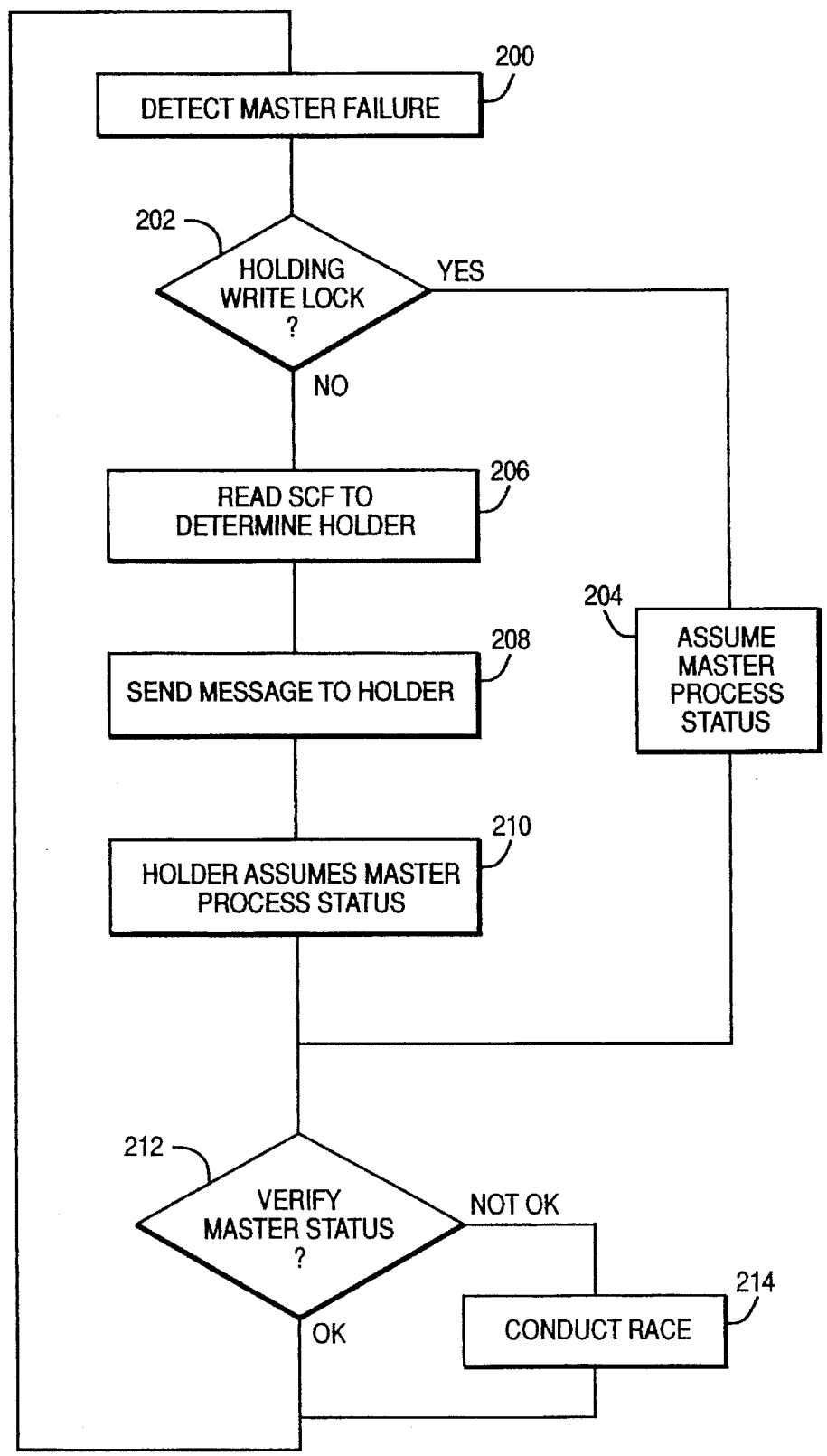
FIG. 4 is a flowchart showing the logic of the preferred embodiment of the present invention.

The process will be described with reference to FIG. 4. First, one of the remaining processes must detect master process failure 200. In a shared file system such as NFS, the file system will notify linked processes of a failure of the other process. In other systems detection of failure may not occur until a message is sent to the master without response. The process detecting master failure next tests to determine whether it is holding the write lock for the resource controlled by the failed master 202. If so, the detecting resource assumes the master processor duties by establishing control over the shared control file for that resource 204. If the detecting process is not the holder of the write lock, it reads the shared control file to determine which process hold the lock 206. A message is sent by the detecting process to the write lock holding process requesting that it assume master process duties 208.

The process receiving the message and holding the write lock attempts to establish itself as the master process 210.

The system next tests to determine whether a new master process has been designated for the resource of the failing process. If so, processing returns to normal state. If a master has not been established, a race is conducted between all shadow process, as is done in the current system.

The shared control file according the preferred embodiment of the present invention, contains the process identity and communications address of the write lock holder. This information could be contained in a file or storage location separate from the shared control file in alternative designs.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

We claim:

1. In a computer network that includes a plurality of processing nodes, a method for distributing control of a write lock for a shared data object from, a master processing node currently in control of the write lock, to one of the plurality of processing nodes requesting use of the write lock upon failure of the master processing node wherein the master processing node fails to transfer the write lock to the processing node requesting use of the write lock, the method comprising the following steps in the sequence set forth:

detecting by the processing node requesting use of the write lock, when the master processing node fails to transfer the write lock to the processing node requesting use of the write lock;

determining, by the processing node requesting use of the write lock, whether the processing node requesting use of the write lock holds the write lock for the shared data object;

when the processing node requesting use of the write lock holds the write lock, requesting that the processing node requesting use of the write lock assume control over the write lock for that shared data object from the master processing node failing to transfer use of the write lock for that shared data object to establish a new master processing node for that shared data object;

when the processing node requesting use of the write lock does not hold the write lock for the shared data object, determining whether another processing node of the plurality of processing nodes holds the write lock for the shared data object;

when the another processing node holds the write lock for the shared data object, requesting that the another processing node assume control over the write lock for that shared data object from the master processing node failing to transfer use of the write lock for that shared data object to establish a new master processing node for that shared data object; and when the another processing node fails to assume control of the write lock, executing a race among the plurality of processing nodes for control of the write lock for that shared data object from the master processing node failing to transfer use of the write lock for that shared data object to establish a new master processing node for that shared data object.

2. The method of claim 1 wherein the step of determining whether the another processing node holds the write lock further comprises accessing, by the processing node, a shared control file to identify the another processing node.

3. The method of claim 1 further comprising the step of, when the processing node is currently holding the write lock, assuming, by the processing node, the master responsibility for the shared data object.

\* \* \* \* \*

UNITED STATES PATENT AND TRADEMARK OFFICE
CERTIFICATE OF CORRECTION

PATENT NO. : 5,550,973

DATED : August 27, 1996

INVENTOR(S) : Forman et al.

It is certified that error appears in the above-indentified patent and that said Letters Patent is hereby corrected as shown below:

Cover page at [63] and Column 1, line 5   Insert --This is a continuation of Serial No. 08/077,231 filed June 14, 1993.--

Signed and Sealed this

Tenth Day of June, 1997

Attest:

BRUCE LEHMAN

Attesting Officer    Commissioner of Patents and Trademarks